(12) United States Patent
Ding et al.

(10) Patent No.: US 12,057,403 B2
(45) Date of Patent: *Aug. 6, 2024

(54) LIGHT ENGINE BASED ON SILICON PHOTONICS TSV INTERPOSER

(71) Applicant: MARVELL ASIA PTE LTD, Singapore (SG)

(72) Inventors: Liang Ding, Westlake Village, CA (US); Radhakrishnan L. Nagarajan, Santa Clara, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/202,666

(22) Filed: May 26, 2023

(65) Prior Publication Data

US 2023/0299008 A1 Sep. 21, 2023

Related U.S. Application Data

(63) Continuation of application No. 17/843,407, filed on Jun. 17, 2022, now Pat. No. 11,664,319, which is a continuation of application No. 16/738,844, filed on Jan. 9, 2020, now Pat. No. 11,367,687, which is a
(Continued)

(51) Int. Cl.
| | |
|---|---|
| *H01L 23/538* | (2006.01) |
| *G02B 6/12* | (2006.01) |
| *G02B 6/42* | (2006.01) |
| *H01L 21/48* | (2006.01) |
| *H01L 21/768* | (2006.01) |

(Continued)

(52) U.S. Cl.
CPC .......... *H01L 23/5384* (2013.01); *G02B 6/428* (2013.01); *H01L 21/486* (2013.01); *H01L 21/76898* (2013.01); *H01L 24/17* (2013.01); *H01L 24/81* (2013.01); *H01L 25/167* (2013.01); *G02B 2006/12061* (2013.01);
(Continued)

(58) Field of Classification Search
CPC .......... H01L 25/167; H01L 2924/12042; H01L 23/5384; H01L 24/81; H01L 24/17; H01L 21/76898; H01L 21/486; G02B 6/428; G02B 2006/12147; G02B 2006/12004
See application file for complete search history.

(56) References Cited

U.S. PATENT DOCUMENTS 9,595,509 B1 3/2017 Yap
9,651,751 B1 5/2017 Ding et al.
(Continued)

*Primary Examiner* — Alonzo Chambliss

(57) ABSTRACT

A method for forming a silicon photonics interposer having through-silicon vias (TSVs). The method includes forming vias in a front side of a silicon substrate and defining primary structures for forming optical devices in the front side. Additionally, the method includes bonding a first handle wafer to the front side and thinning down the silicon substrate from the back side and forming bumps at the back side to couple with a conductive material in the vias. Furthermore, the method includes bonding a second handle wafer to the back side and debonding the first handle wafer from the front side to form secondary structures based on the primary structures. Moreover, the method includes forming pads at the front side to couple with the bumps at the back side before completing final structures based on the secondary structures and debonding the second handle wafer from the back side.

10 Claims, 14 Drawing Sheets

Related U.S. Application Data continuation of application No. 15/887,758, filed on Feb. 2, 2018, now Pat. No. 10,566,287.

(51) Int. Cl.
  *H01L 23/00* (2006.01)
  *H01L 25/16* (2023.01)

(52) U.S. Cl.
  CPC .. *H01L 21/768* (2013.01); *H01L 2924/12042* (2013.01); *H01L 2924/14* (2013.01); *H01L 2924/157* (2013.01)

(56) References Cited

U.S. PATENT DOCUMENTS

| | | |
|---|---|---|
| 10,001,611 B2 | 6/2018 | Ding et al. |
| 10,547,156 B1 | 1/2020 | Bovington et al. |
| 10,566,287 B1 | 2/2020 | Ding et al. |
| 10,826,613 B1 | 11/2020 | Liang et al. |
| 10,892,830 B1 | 1/2021 | Liang et al. |
| 10,924,269 B1 | 2/2021 | Ding et al. |
| 11,367,687 B2 | 6/2022 | Ding |
| 11,664,319 B2 * | 5/2023 | Ding ................ H01L 24/81 361/783 |
| 2006/0267176 A1 | 11/2006 | Offrein |
| 2008/0138088 A1 | 6/2008 | Welch et al. |
| 2009/0035940 A1 | 2/2009 | Richardson et al. |
| 2010/0098374 A1 | 4/2010 | Althaus |
| 2013/0148984 A1 | 6/2013 | Kalogerakis et al. |
| 2015/0295098 A1 | 10/2015 | Toda |
| 2016/0163590 A1 | 6/2016 | Jung et al. |
| 2017/0254968 A1 | 9/2017 | Ding et al. |
| 2017/0323787 A1 | 11/2017 | Kuwabara et al. |
| 2020/0225429 A1 | 7/2020 | Nagarajan et al. |

\* cited by examiner

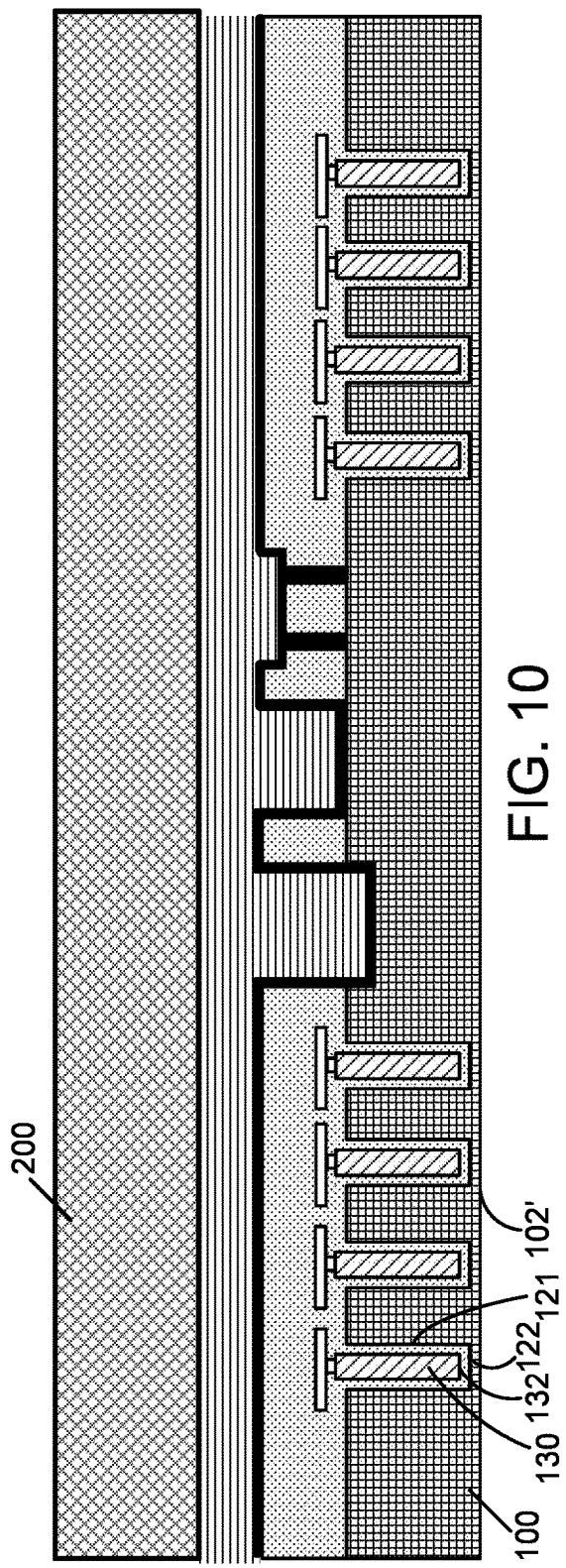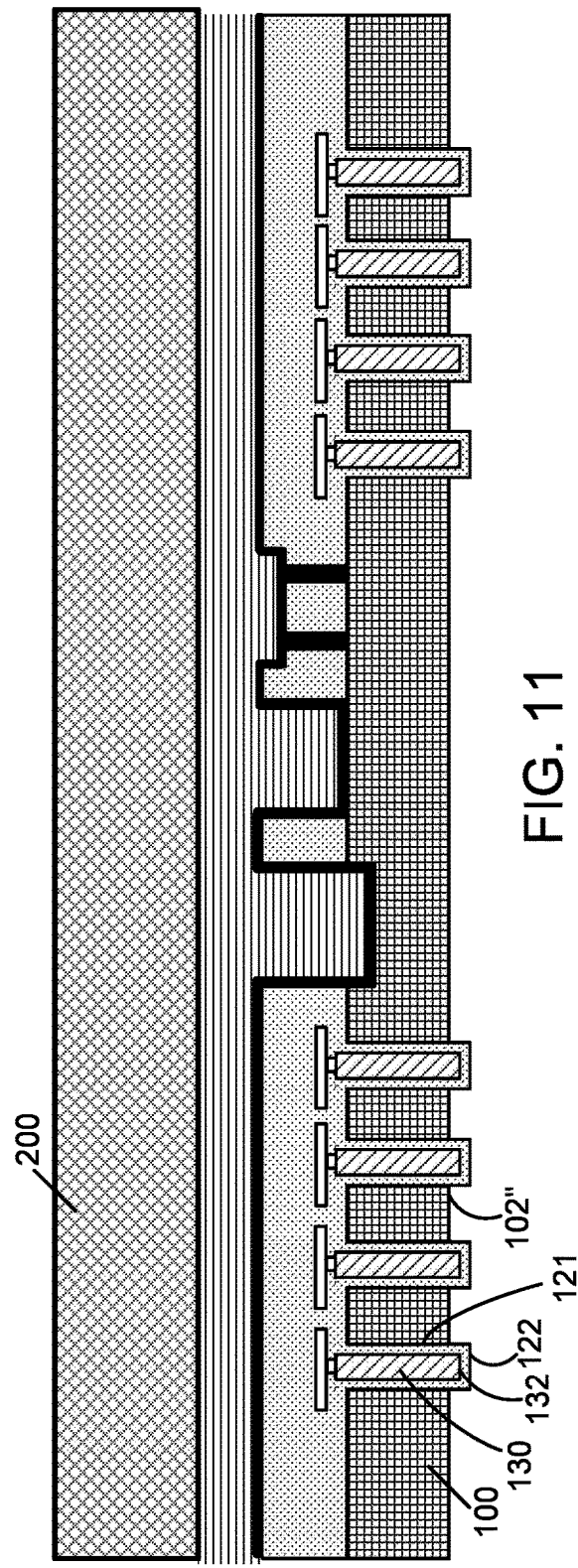

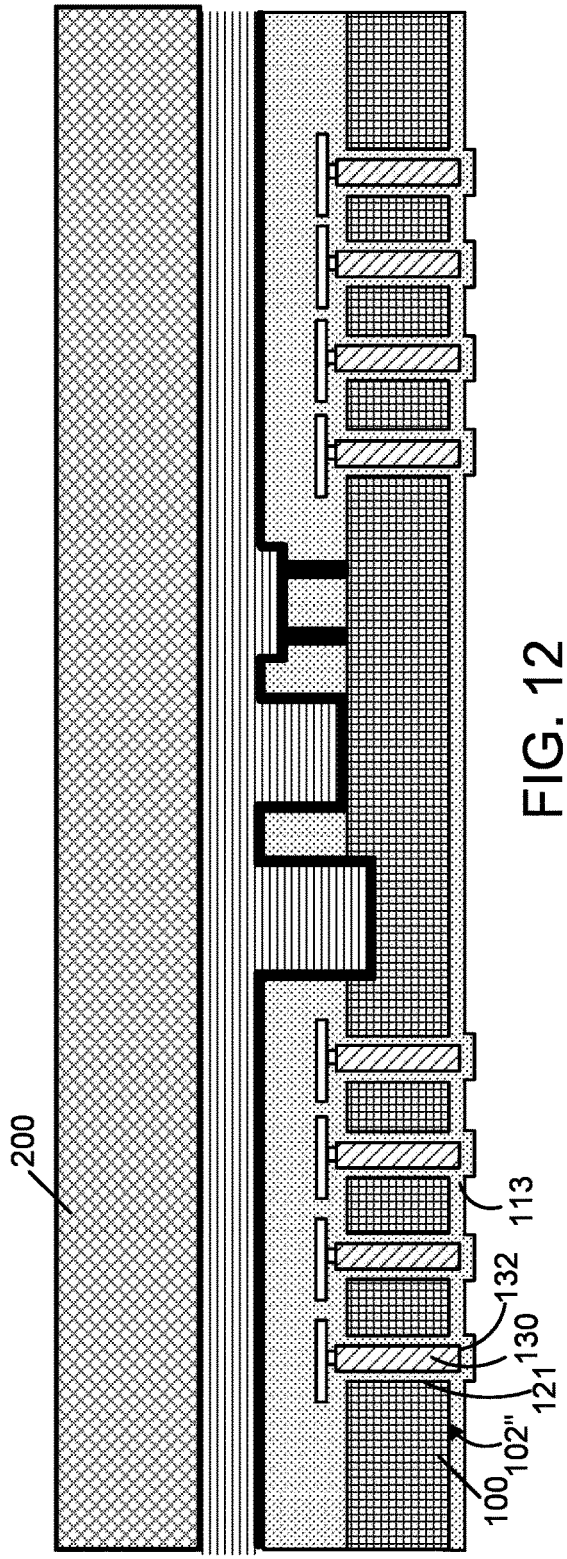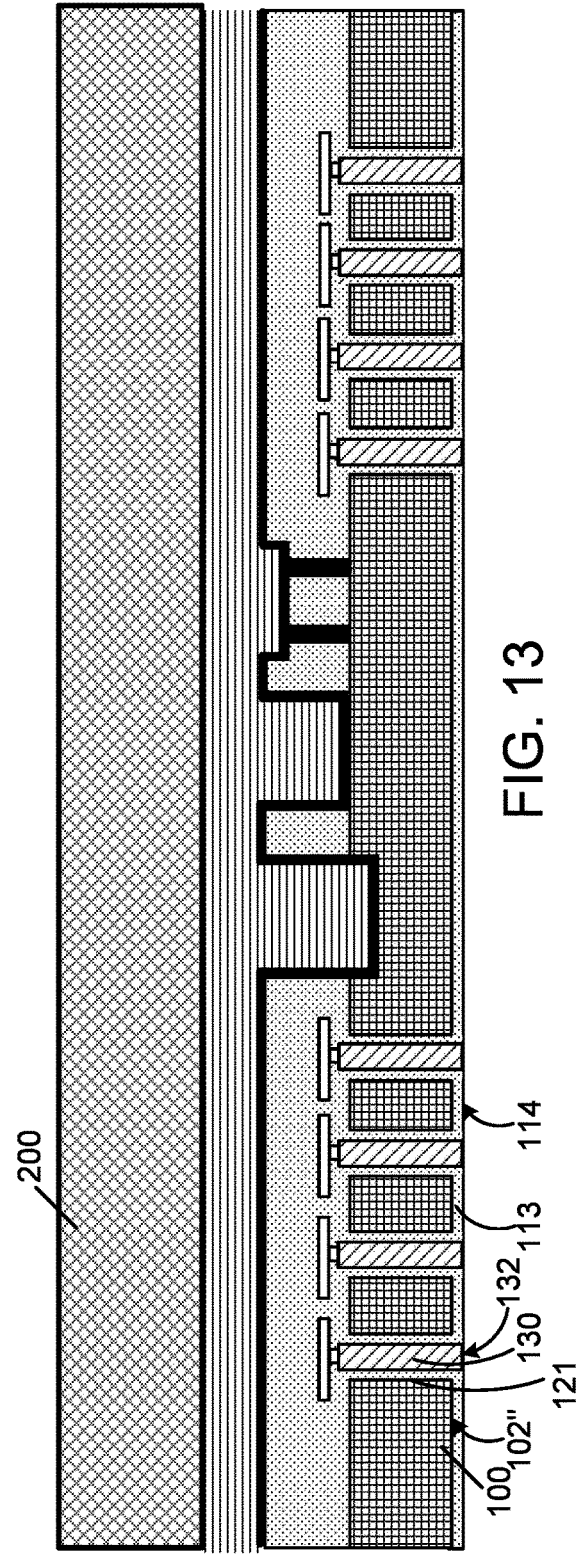

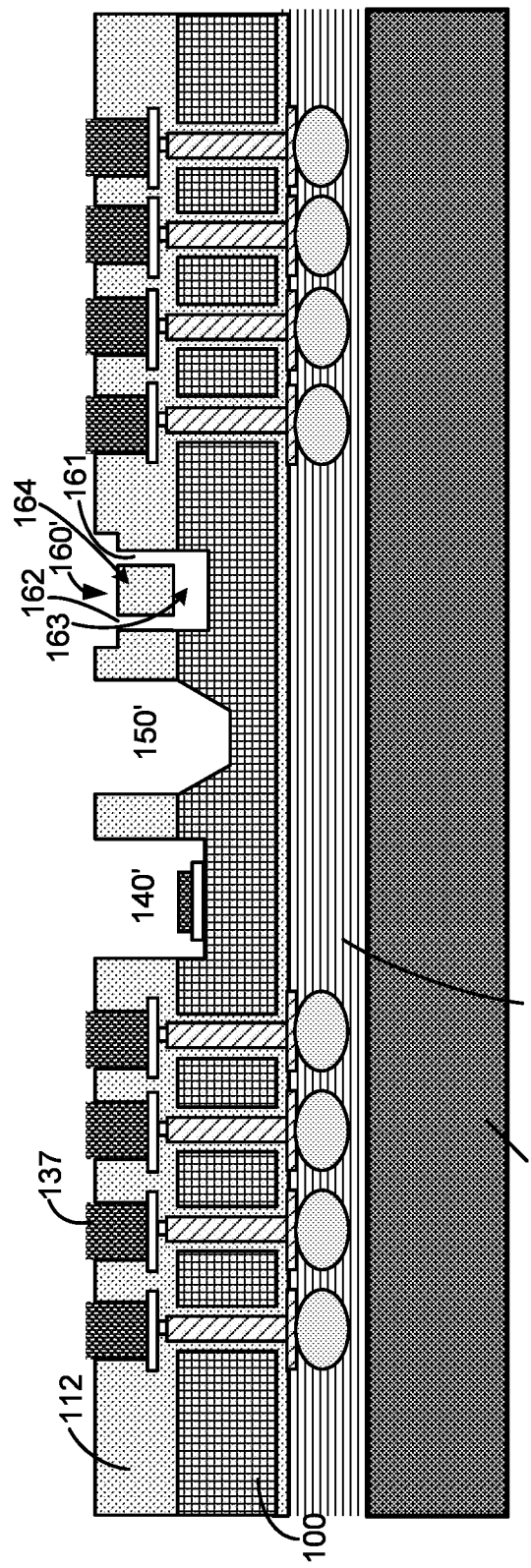
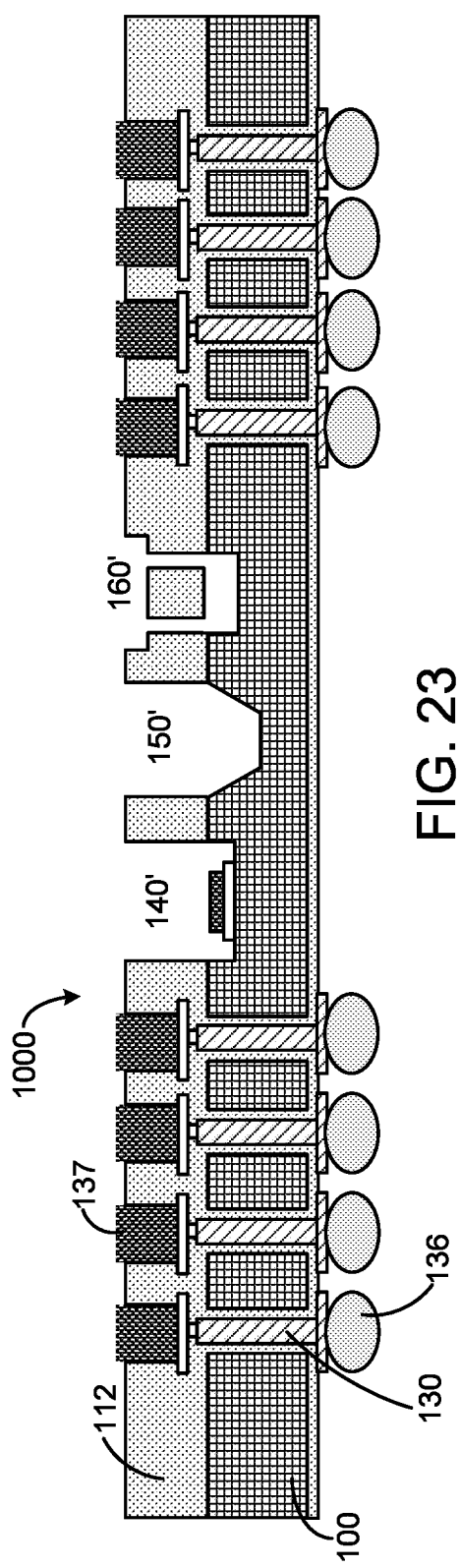

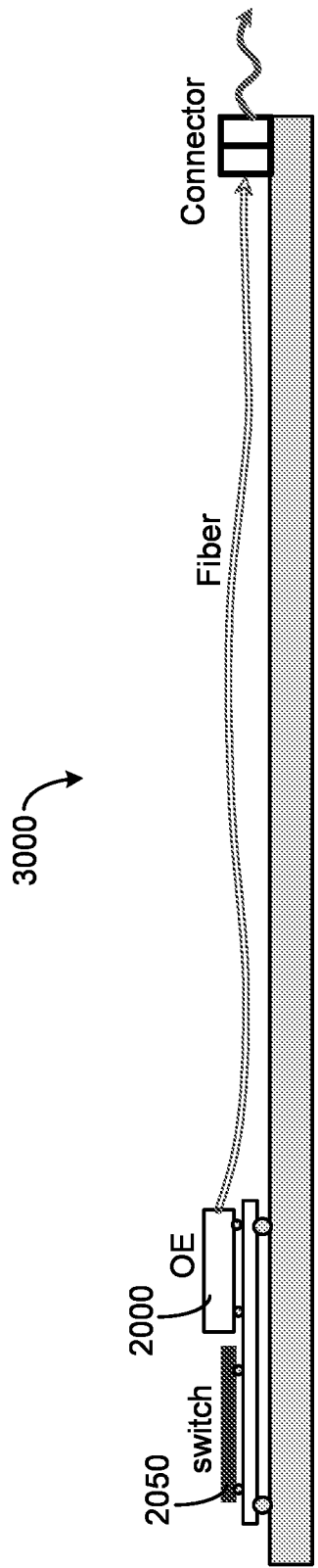

LIGHT ENGINE BASED ON SILICON PHOTONICS TSV INTERPOSER

CROSS-REFERENCE TO RELATED APPLICATIONS

This application is a continuation application of and claims priority to U.S. application Ser. No. 17/843,407, filed Jun. 17, 2022, now U.S. Pat. No. 11,664,319, issued May 30, 3023, which is a continuation application of and claims priority to Ser. No. 16/738,844, filed Jan. 9, 2020, now U.S. Pat. No. 11,367,687, issued Jun. 21, 2022, which is a continuation application of and claims priority to U.S. application Ser. No. 15/887,758, filed Feb. 2, 2018, now U.S. Pat. No. 10,566,287, issued Feb. 18, 2020, commonly assigned and incorporated by reference herein for all purposes.

BACKGROUND OF THE INVENTION

The present disclosure is related to manufacture technique for integrated silicon photonics device, and particularly to a light engine based on a silicon photonics through-silicon via interposer and a method of making the same.

As science and technology are updated rapidly, processing speed and capacity of the computer increase correspondingly. The need for optical interconnect for high-performance computing and data center applications are indispensable with increasing demand. An optical communication system includes both electrical devices and optical devices, devices for converting electrical signal and optical signal back and forth, and devices for processing these signals. With the advances of optical communication technology and applications driven by the market demand on increasing bandwidth and decreasing package footprint, more intensive effort and progress have been seen in the development of electro-photonic integrated circuits on silicon-on-insulator (SOI) substrate for forming those communication devices including pluggable photonics modules.

With the increase data density of large data center switches, the pluggable optical module solution has seen bottle neck due to the electrical link performance between switch cores and optical transceivers. The technology trend to move the optical transceiver functions closer to switch core is becoming clear. With the linecard approaching to data-rate of 56 Gbaud or above, package solutions based on wire bonds no longer fulfill the system bandwidth requirement. It is desirable to have a compact optical engine that is provided as on-board module or co-integrated with switches in high data rate communication applications.

BRIEF SUMMARY OF THE INVENTION

The present disclosure is related to manufacture technique for integrated silicon photonics device. More particularly, the invention provides a light engine based on a silicon photonics through-silicon via interposer and a method of making the same. In certain embodiments, the invention is applied for high data rate optical communication, though other applications are possible.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

In a specific embodiment, the present invention provides a method for forming a silicon photonics interposer having through-silicon vias (TSVs). The method includes providing a silicon substrate including a front side and a back side and forming a plurality of vias into the silicon substrate in the front side. The method further includes filling a conductive material in the plurality of vias including a conductive pattern routed on the front side. Furthermore, the method includes defining primary structures associated with optical features in the front side and masking the front side including the conductive material in the plurality of vias and the primary structures associated with optical features. Additionally, the method includes bonding a first handle wafer to the front side of the silicon substrate and thinning down the silicon substrate from the back side and forming a plurality of conductive bumps to respectively couple with the conductive material in the plurality of vias at the back side. The method further includes bonding a second handle wafer to the back side including the plurality of conductive bumps and debonding the first handle wafer from the front side. Furthermore, the method includes forming secondary structures based on the primary structures associated with optical features and forming a plurality of conductive pads at the front side coupled respectively with the conductive material in the plurality of vias. The method further includes completing final structures based on the secondary structures in the front side. Moreover, the method includes debonding the second handle wafer from the back side.

In an alternative embodiment, the present invention provides a method of making an optical-electrical module based on silicon photonics TSV interposer. The method includes forming a silicon photonics TSV interposer using the method described herein. Then, the method further includes attaching a laser device to couple at least an electrode with a solder pad in a trench structure of the final structures in the front side of the silicon photonics TSV interposer. Additionally, the method includes fixing a fiber into a V-groove of the final structures with a lid. The fiber is coupled with the laser device. Furthermore, the method includes disposing a transimpedance amplifier (TIA) module chip that is flipped in orientation to have multiple electrodes of the TIA module chip coupled with some of the plurality of conductive pads. Moreover, the method includes disposing a driver chip that is flipped in orientation to have multiple electrodes of the driver chip coupled with some of the plurality of conductive pads.

In yet another alternative embodiment, the present disclosure provides an optical-electrical module based on silicon photonics TSV interposer. The optical-electrical module includes a silicon substrate including a front side and a back side and a plurality of through-silicon vias (TSVs) formed in a first region of the silicon substrate. Each TSV is configured to fill a conductor material ended with a pad at the front side and a bump at the back side. The optical-electrical module further includes a coupler suspended over a cavity in the front side. The cavity is formed in a second region isolated from the first region after the plurality of TSVs is formed. Additionally, the optical-electrical module includes a laser device disposed in a trench in the second region of the front side and a fiber installed in a V-groove in the second region of the front side. The fiber is configured to couple with the coupler and the laser device. Furthermore, the optical-electrical module includes one or more electrical IC chips having electrodes coupled directly with some pads at the front side that electrically connected to some bumps at the back side through the conductive material in the plurality of TSVs.

In still another alternative embodiment, the present disclosure provides a light engine including a switch module and the optical-electrical module described herein that is co-integrated on a printed circuit board coupled with an Ultra Short Reach (USR) or Extra Short Reach (XSR) electrical interface and connected to an optical connector via a fiber.

Many benefits are provided with the improvement according to the present invention. In certain embodiments, the present invention provides a replacement of wire bonds by "bump-TSV-trace-bump" or "bump-trace-TSV-trace-bump" in a chip scale package (CSP) with better RF performance. In some embodiments, the chip-scale-package using (through-silicon via) TSV silicon photonics interposer consumes less PCB space. In some other embodiments, with the TSV process, multilayer capacitors (MLCs) can be fabricated simultaneously to eliminate the use of stand-alone DC blocking capacitors and by-pass capacitors on PCB. The present invention achieves these benefits and others in the context of broadband communication technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIGS. 1 through 23 are schematic diagrams illustrating a method of fabricating a silicon photonics interposer having through-silicon vias (TSVs) according to an embodiment of the present invention.

FIG. 25 is a schematic sectional view of a light engine with a switch and co-integrated the optical-electrical module based on the silicon photonics TSV interposer according to an embodiment of the present invention.

DETAILED DESCRIPTION OF THE INVENTION

Figure 1:
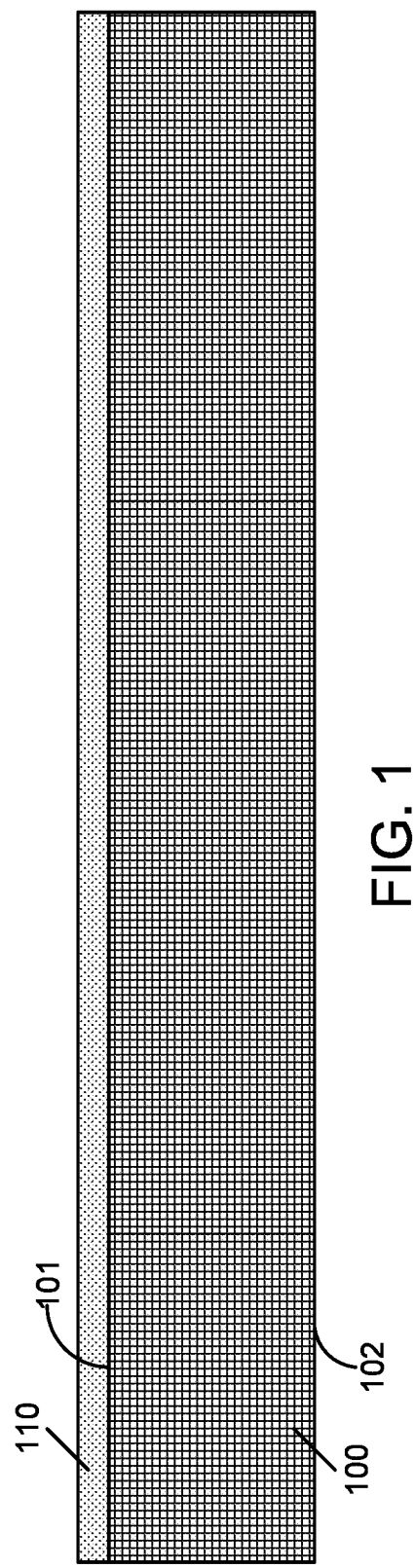

The present disclosure is related to manufacture technique for integrated silicon photonics device. More particularly, the invention provides a light engine based on a silicon photonics through-silicon via interposer and a method of making the same. In certain embodiments, the invention is applied for high data rate optical communication, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Through-Silicon Via (TSV) wafer process has been introduced for making many electrical IC devices. After TSV is formed, the biggest challenging part is to reveal TSV from wafer backside and perform backside routing/bumping. A wafer for forming silicon photonics modules has to fabricate many optical packaging features including suspended coupler, and V-groove, and laser trench. The suspended coupler has a very fragile structure. The V-groove and laser trench both need deep topography processes. These optical packaging features introduce increased process complexity and challenge to achieve a robust backside processing on a bonded silicon photonics wafer. The present disclosure provides a novel method of fabricating a silicon photonics TSV interposer that overcomes the challenge associated with the fragile V-groove and suspended coupler.

FIGS. 1 through 23 are schematic diagrams illustrating a method of fabricating a silicon photonics interposer having through-silicon vias (TSVs) according to an embodiment of the present invention. These diagrams are merely examples, which should not unduly limit the scope of the claims. One of ordinary skill in the art would recognize many variations, alternatives, and modifications. Note that each figure shows a snapshot of one or more processes performed to fabricate a silicon photonics TSV interposer according to one or more embodiments of the disclosed method. Some processes may be performed in different orders. Some processes may be replaced by other processes to achieve substantially similar results. Some processes can be executed using different techniques without being fully listed in the specification.

Some processes may be omitted without affecting the claimed feature of the method.

Referring to FIG. 1, a silicon photonics wafer is provided for making a through-silicon via (TSV) interposer. In the example, the silicon photonics wafer is a silicon substrate 100 having a front side 101 and a back side 102. Optionally, the silicon substrate 100 is covered by a layer of silicon dioxide 110. Optionally, the silicon dioxide is schematically referred to an optical layer 110 formed on the front side 101 for forming one or more optical features or waveguides. Optionally, at least a patterned metallization layer (not shown) is also formed in the front side 101. Optionally, the method of making a silicon photonics TSV interposer starts after the optical layers and all metallization layers are completed. This is called TSV-last process.

Figure 2:
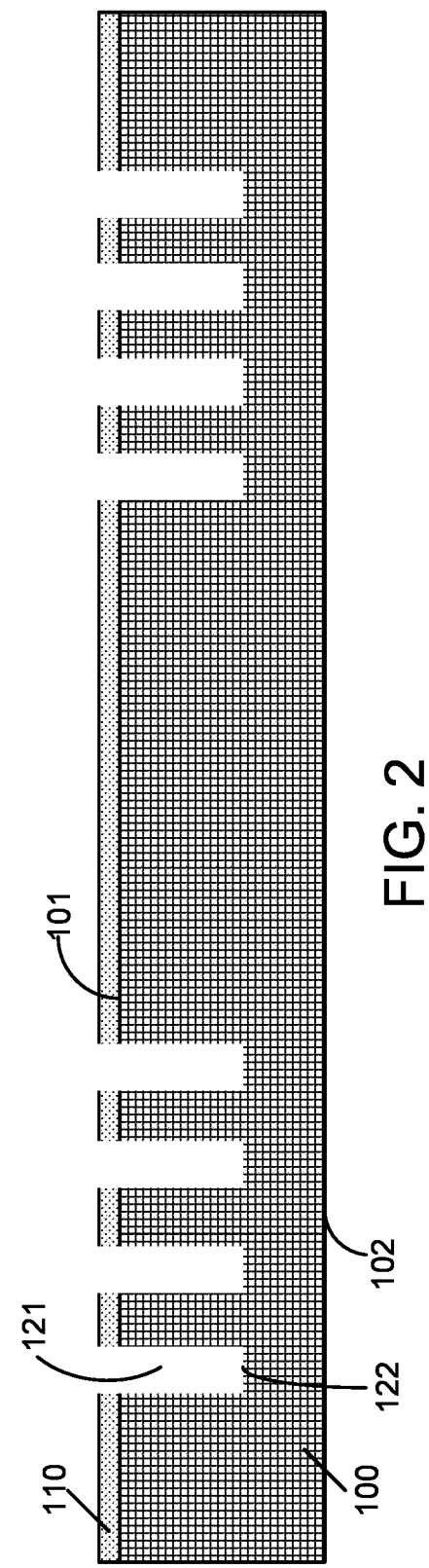

Referring to FIG. 2, in an embodiment, the method includes a TSV process for forming a plurality of vias 121 by etching from the optical layer 110 in the front side 101. Optionally, the etching process includes Bosch etching, which is a deep reactive-ion etching with highly anisotropic nature to create deep penetration, steep-sided holes with near 900 vertical walls. Optionally, via 121 is characterized by a lateral dimension of about 30 μm and a depth of about 250 μm down to a bottom 122. Optionally, the plurality of vias 121 is formed in a first region of the front side 101 of the silicon substrate 100. Optionally, the first region includes one or more sub-regions and the plurality of vias 121 in each sub-region may be arranged with different distributions, spacing, and numbers depended on applications.

Figure 3:
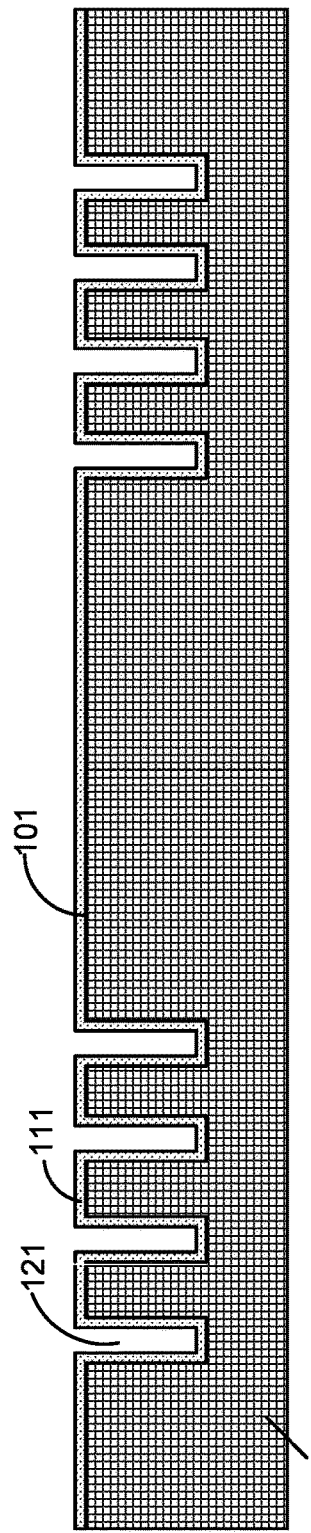

Referring to FIG. 3, the method also includes another step of the TSV process to perform a liner oxide deposition at a temperature <400° C. to form an oxide layer 111 overlying the bottom 122 and side wall of each via 121 as well as any top portion of the front side 101 without the vias. Techniques like PECVD and SACVD are choices for performing the liner oxide deposition.

Figure 4:
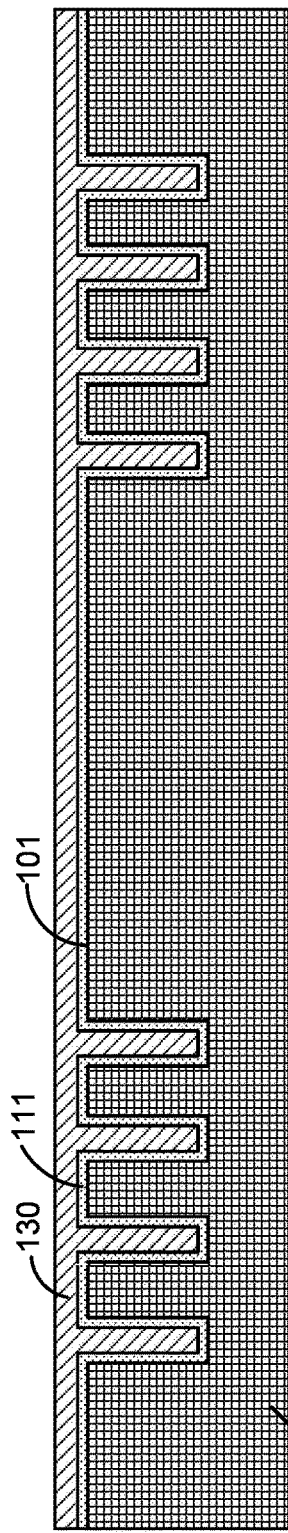

FIG. 4 shows one or more steps of the TSV process for filling a conductive material 130 inside the plurality of vias 121. In the example, a sputtering process is firstly employed to form a barrier layer (not explicitly shown in FIG. 4) overlying the oxide layer 111. The barrier layer is typically made by material selected from Ti, TiN, Ta, and TaN. Secondly, a conductive material 130 is filled in the vias 121. Usually, the conductive material 130 is Cu. The barrier layer is configured to prevent Cu in the vias 121 from diffusing into its surrounding part in the silicon substrate 100.

Figure 5:
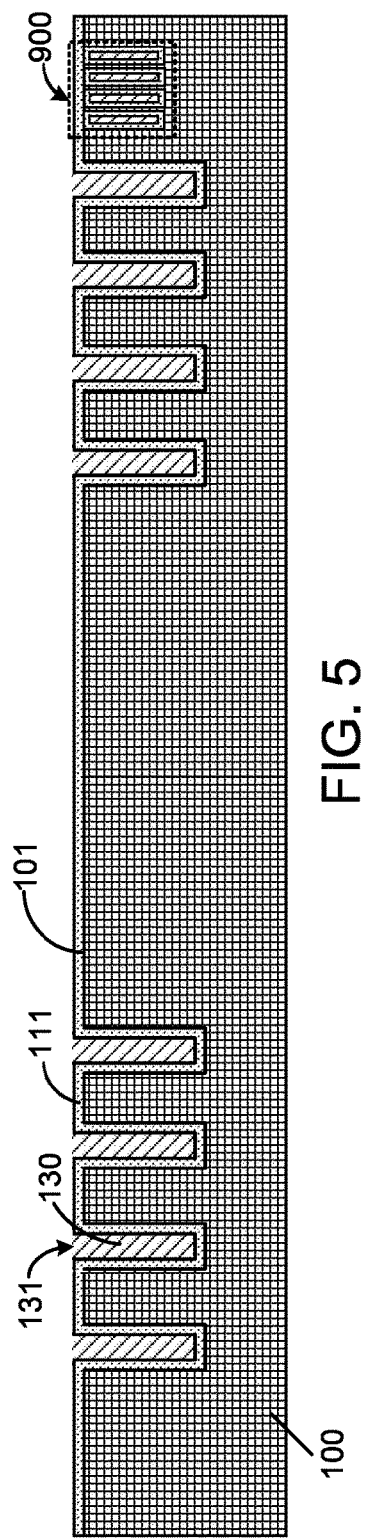

FIG. 5 is a schematic diagram of showing additional steps of the TSV process for removing extra residues of the conductive material 130 from top of the oxide layer 111 on the front side 101 by performing a planarization process according to an embodiment of the present invention. Optionally, the steps include annealing process and performing a chemical-mechanical planarization process. As shown, the steps lead to substantially removal of extra conductive material on the front side surface but to reveal a front end 131 of the conductive material 130 associated with each via within a surface of oxide layer 111. Optionally, the TSV process described above can be accompanied with a process for forming one or more multi-layer capacitors 900 near the front side 101 of the silicon substrate 100. Optionally, the multi-layer capacitors 900 are formed in a third region separated from the first region used for forming the TSVs. It is also executed by several etching steps, oxidation steps, metal plating steps, and planarization steps.

Figure 6:
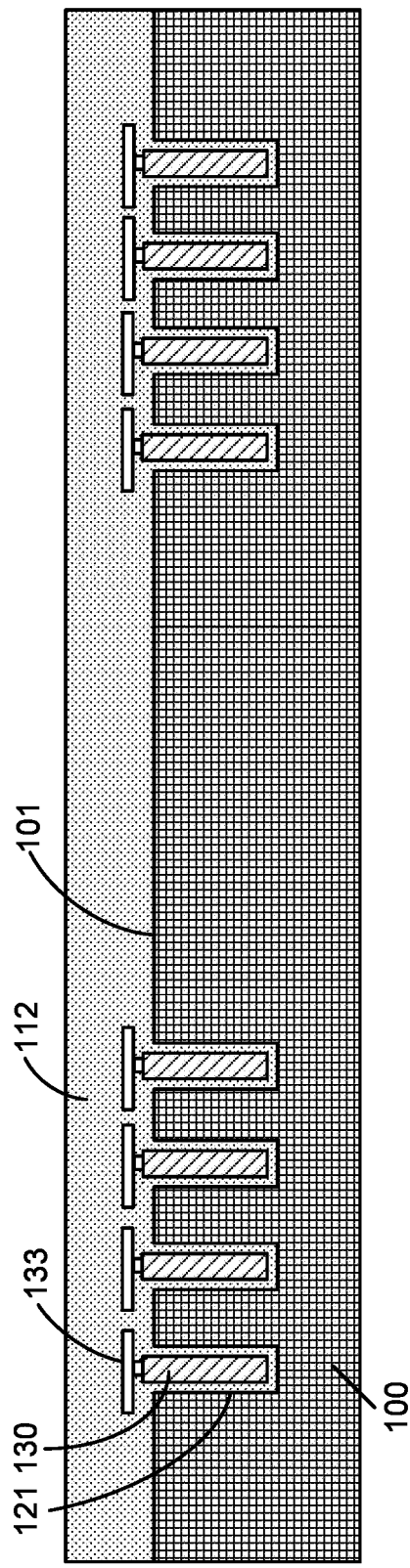

Referring to FIG. 6, the method includes a post-TSV metal routing process for forming a conductive pattern routed to connect some of the front ends 131 of the conductive material 130 filled in the plurality of vias. Optionally, an extended metallization structure 133 is formed that electrically couples with the conductive material 130 in a via 121. The method then includes a post-TSV passivation process for forming a first passivation layer 112 to cover entire front side of the silicon substrate 100. Optionally, the first passivation layer 112 at least covers the first region having extended metallization structure 133 over each front end of the conductive material 130 associated with the vias 121. Optionally, the first passivation layer 112 also covers a second region separated from the first region without TSVs. Optionally, the first passivation layer 112 additionally covers the third region with the multi-layer capacitors 900. Optionally, the first passivation layer 112 is also an oxide layer made by substantially the same material as the oxide layer 111. Optionally, the first passivation layer 112 is a silicon dioxide ($SiO_2$) layer.

Figure 7:
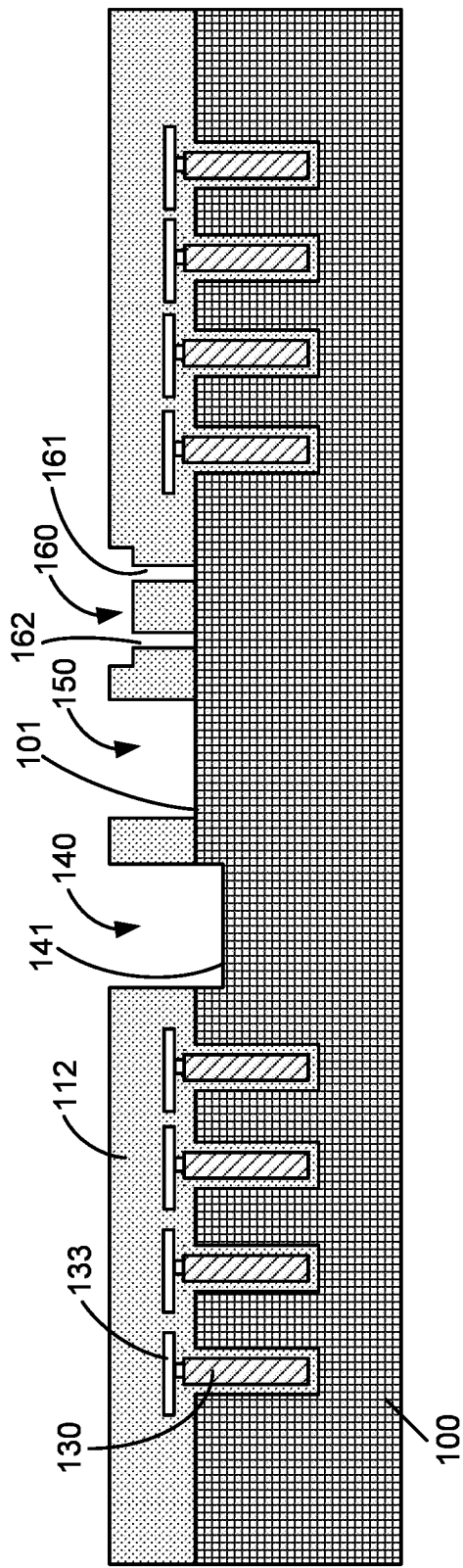

FIG. 7 is a schematic diagram illustrating a step of defining primary structures associated with optical features in the front side according to an embodiment of the present invention. This diagram is merely an example, which should not unduly limit the scope of the claims. One of ordinary skill in the art would recognize many variations, alternatives, and modifications. As shown, the step is several etching processes executed in a second region separated from the first region for forming the plurality of vias that have been turned to TSVs with filled conductive material 130. Optionally, in a first sub-region of the second region, a first structure 160 of the primary structures is formed by performing a first etch to form a shallow wide trench into the first passivation layer 112 and performing a second etch further through the first passivation layer 112 at two separate locations in the shallow wide trench 160 to form two deep narrow trenches 161 and 162 stopped at silicon material of the front side 101. Optionally, in a second sub-region of the second region, a second structure 150 is formed and configured to form a V-groove. In this step, the second structure 150 is a trench etched into the first passivation layer 112 with a bottom at the silicon material of the front side 101. Optionally, in a third sub-region of the second region, a trench structure 140 is formed and configured to mount a laser device. The trench structure 140 is formed by etching through the first passivation layer 112 and further into a depth of the silicon material of the front side 101. Optionally, the primary structures associated with optical features include a combination of the first structure 160, the second structure 150, and the trench structure 140. Optionally, other structures associated with optical features can be formed in the second region separated from the first region. Of course, there can be other alternatives, variations, and modifications.

Figure 8:
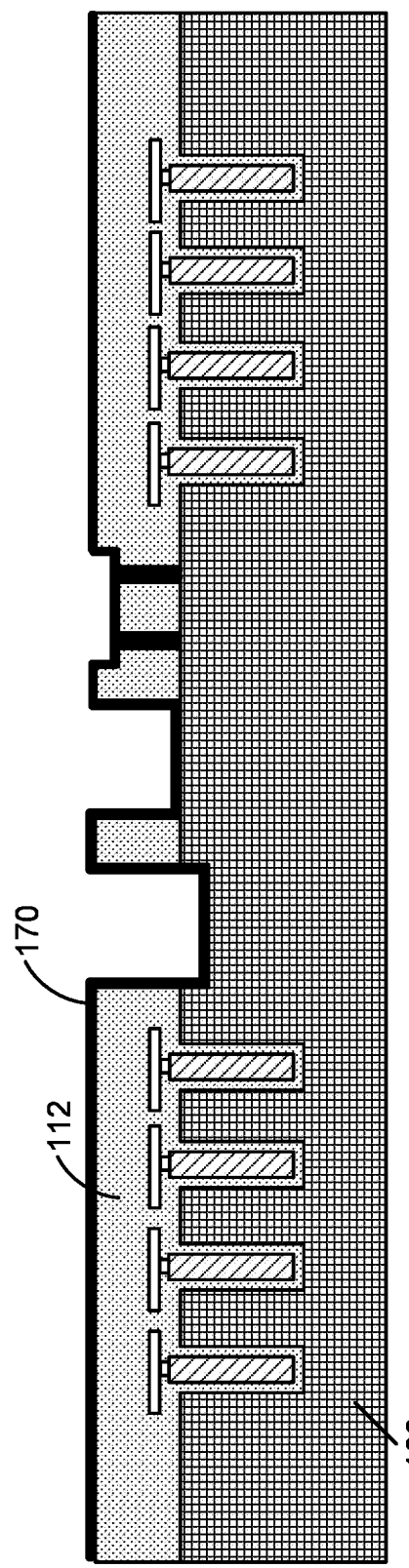

Referring to FIG. 8, the method includes forming a mask layer 170 of hard silicon nitride ($Si_3N_4$) overlying the primary structures (140, 150, and 160) associated with optical features as well as the remaining part of the first passivation layer 112. The mask layer 170 is configured to protect the structures formed up to this stage on the entire front side of the silicon substrate 100. Optionally, the hard silicon nitride ($Si_3N_4$) layer of at least 1000 Angstroms is formed. Optionally, the hard silicon nitride ($Si_3N_4$) layer of up to 2000 Angstroms is formed. Other thicknesses of the mask layer 170 made by alternative materials may be applicable.

Figure 9:
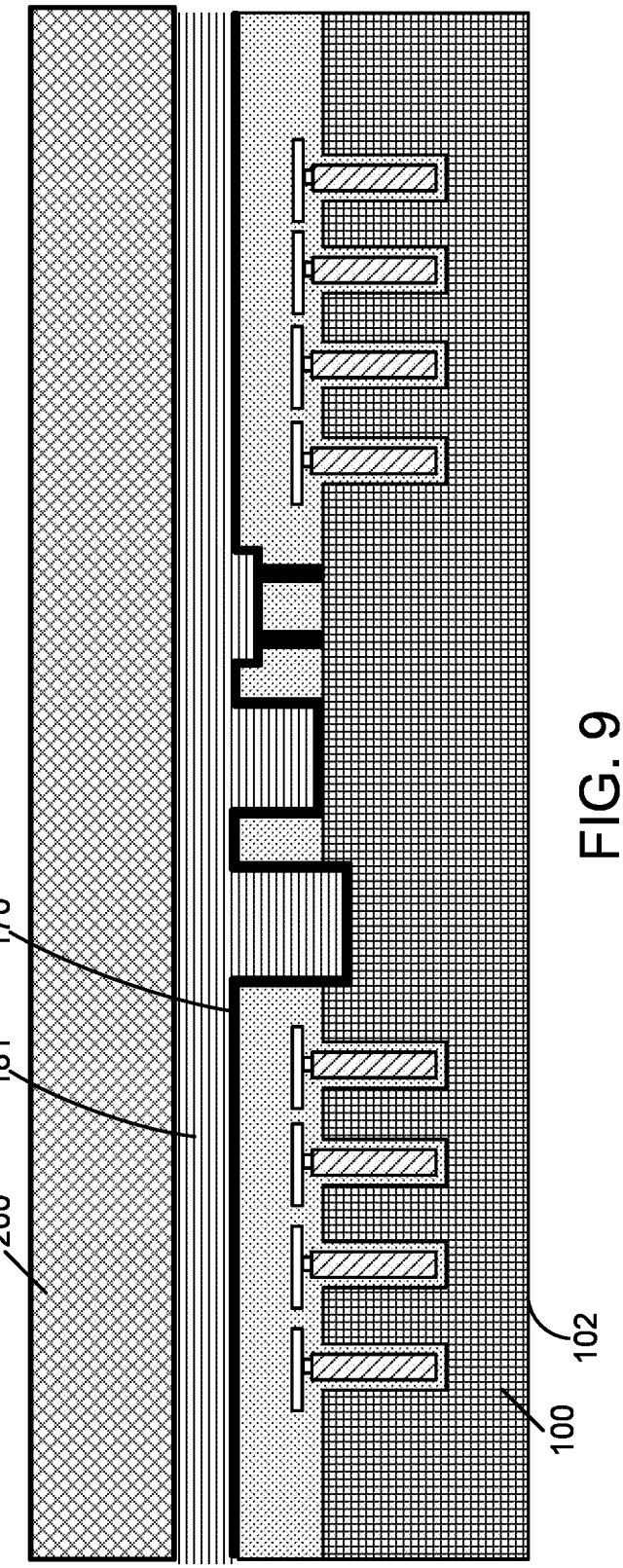

FIG. 9 shows a step of bonding a first handle wafer 200 to the front side of the silicon substrate 100 via a thick layer of temporary adhesive material 181. The adhesive material 181 is placed over the mask layer 170 which provides full protection of the structures formed on the front side of the silicon substrate 100. Optionally, the first handle wafer 200 can be a silicon carrier wafer. Optionally, the first handle wafer 200 is a glass carrier wafer. Now, as the first handle wafer 200 is firmly yet temporarily attached with the front side of the silicon substrate 100, the back side 102 of the silicon substrate is available for any backside processes.

FIG. 10 shows a first step of the backside process to reduce thickness of the silicon substrate 100 from the back side 102. In particular, the first step is thinning down the silicon substrate 100 to transform original back side 102 to a new back side 102' to just leave a few microns to the bottom 122 of the via 121. Optionally, the thinning process is stopped at the new back side 102' that is 2 to 5 microns away from the bottom 122 of the via 121. Referring to FIG. 10 and FIG. 3, the bottom 122 is an interface between the oxide layer 111 and the silicon material.

FIG. 11 shows a second step of the backside process to further reduce thickness of the silicon substrate 100 from the back side 102' to another new back side 102". In particular, the second step is a Si dry etch process that is able to make the bottom 122 of the TSV 121 protruded out of the back side 102" by a few microns. The Si dry etch is characterized by a high selectivity of Si material over $SiO_2$ material in terms of a ratio 10:1. As the new back side 102" is moved to below (or above as seen in FIG. 11) the bottom 122 of the via 121, the oxide layer 111 at the bottom 122 is still substantially retained to cover the back end 132 of the conductive material 130 in the vias 121. Optionally, the back side 102" is set to be below (or above as seen in FIG. 11) the back end 132 of the conductive material 130.

FIG. 12 shows a third step of the backside process to form a second passivation layer 113 overlying the new back side 102". Optionally, the second passivation layer 113 is formed using a low temperature (<200° C.) deposition of $SiO_2$ material of 2 to 3 microns in thickness. The low temperature deposition is designed to make sure that the temporary adhesive material 181 can sustain the heat to maintain a strong bonding between the first handle wafer 200 and the front side of the silicon substrate 100.

FIG. 13 shows a fourth step of the backside process to planarize the back side and reveal the back end of the conductive material in the TSV. In particular, a CMP process is executed to obtain a planarized surface 114 of the second passivation layer 113, which covers the new back side 102". The CMP process is performed until the back end 132 of the conductive material 130 in each via 121 is just revealed within the planarized surface 114. Again, this step is possible with the first handle wafer 200 is employed to temporarily attach with hard masked front side of the silicon substrate 100 to allow the backside process to be executed properly at the back side of the silicon substrate 100.

Figure 14:
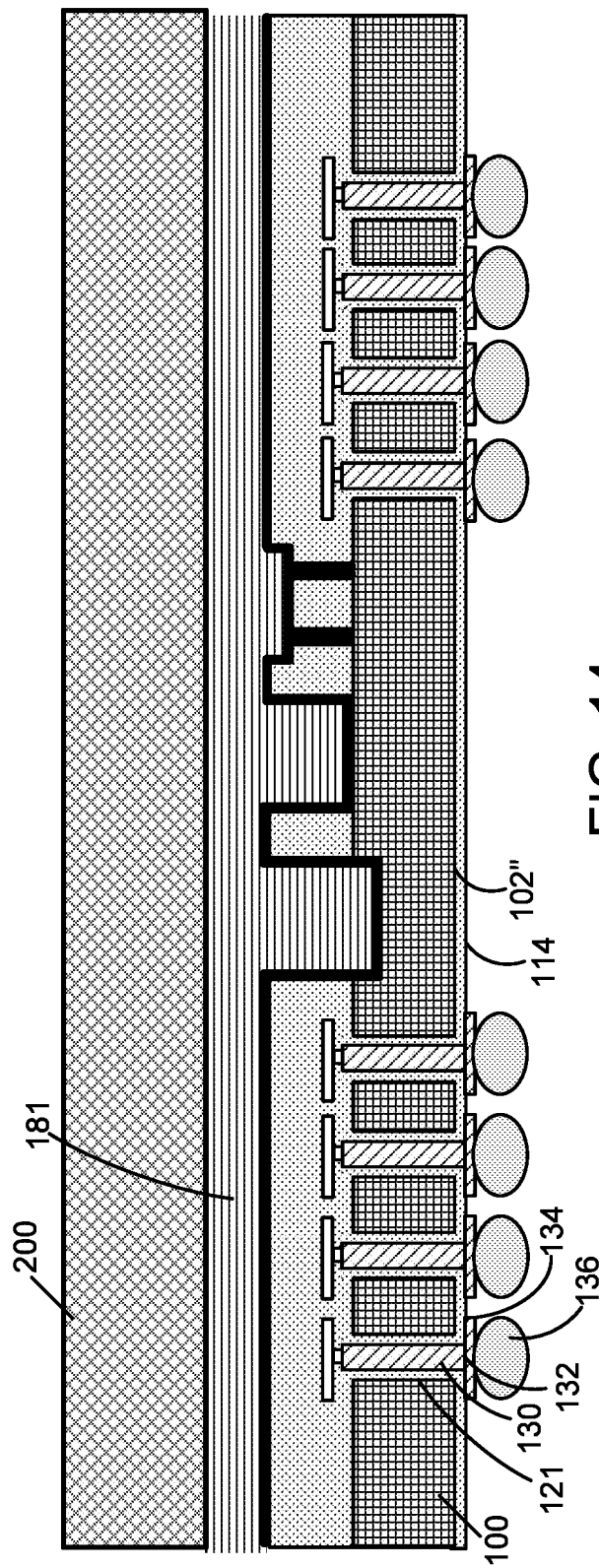

FIG. 14 shows a final step of the backside process, in which a backside routing of conductive pattern and solder bump formation are performed. As shown, on the planarized surface 114, the conductive pattern is routed with an under-bump metallization structure 134 formed to couple with each back end 132 of the conductive material 130 in the vias 121. On the under-bump metallization structure 134 a solder bump 136 is formed, which is configured to form direct electrical connection with a circuit board when the silicon substrate 100 is used as a silicon photonics TSV interposer.

Figure 15:
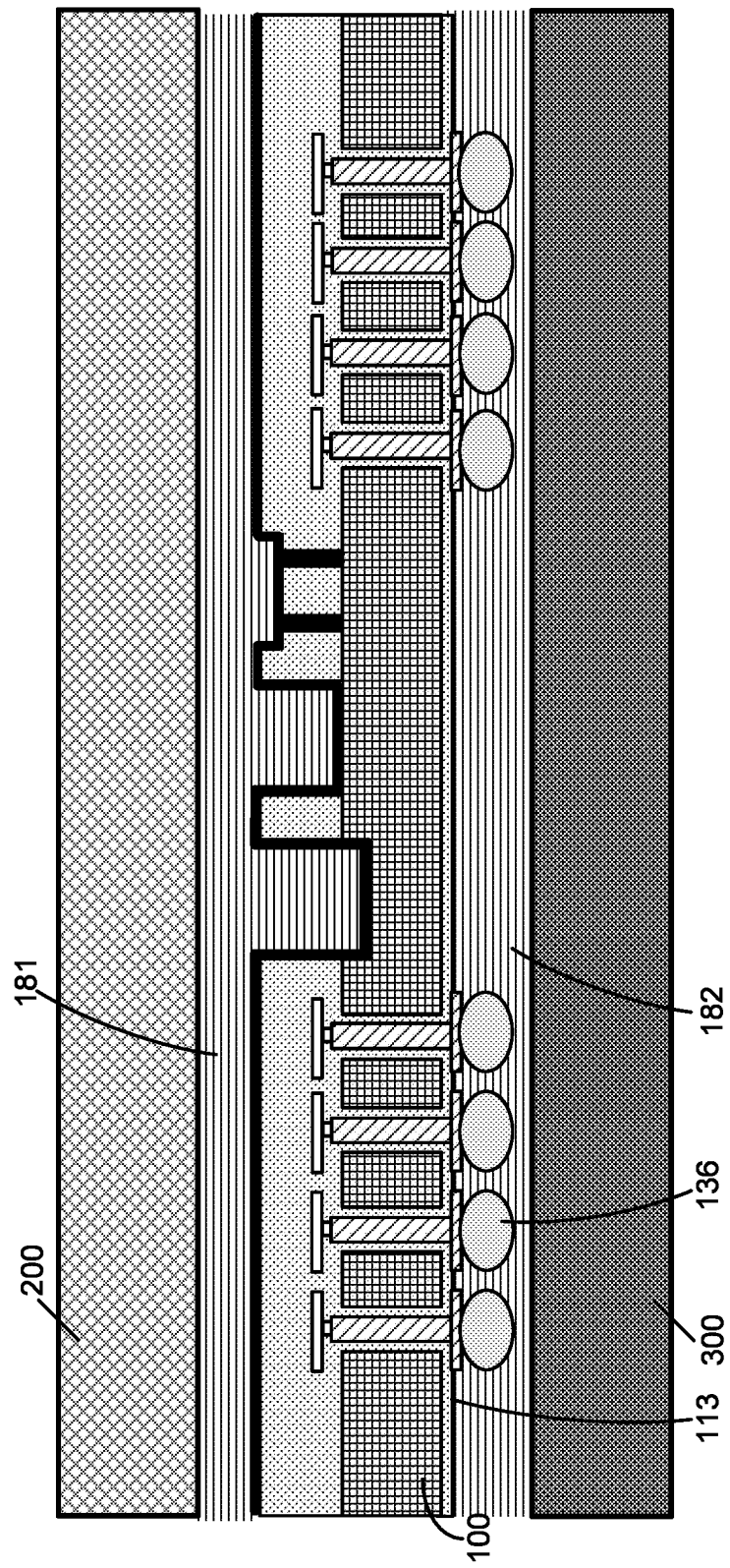

FIG. 15 shows a step of bonding a second handle wafer to the back side after the backside process. In particular, a temporary adhesive material 182 is coated over entire back side including the conductive pattern routed on the planarized surface 114 and all the solder bumps 136 that are electrically coupled with the conductive material 130 in all TSVs in the silicon substrate 100. The second handle wafer 300 then is attached to the adhesive material 182 to be bonded temporarily with the silicon substrate 100. Optionally, the second handle wafer is a silicon carrier wafer. Optionally, the second handle wafer is a glass carrier wafer. At this time, the first handle wafer 200 remains to bond with front side of the silicon substrate 100 via the temporary adhesive material 181.

Figure 16:
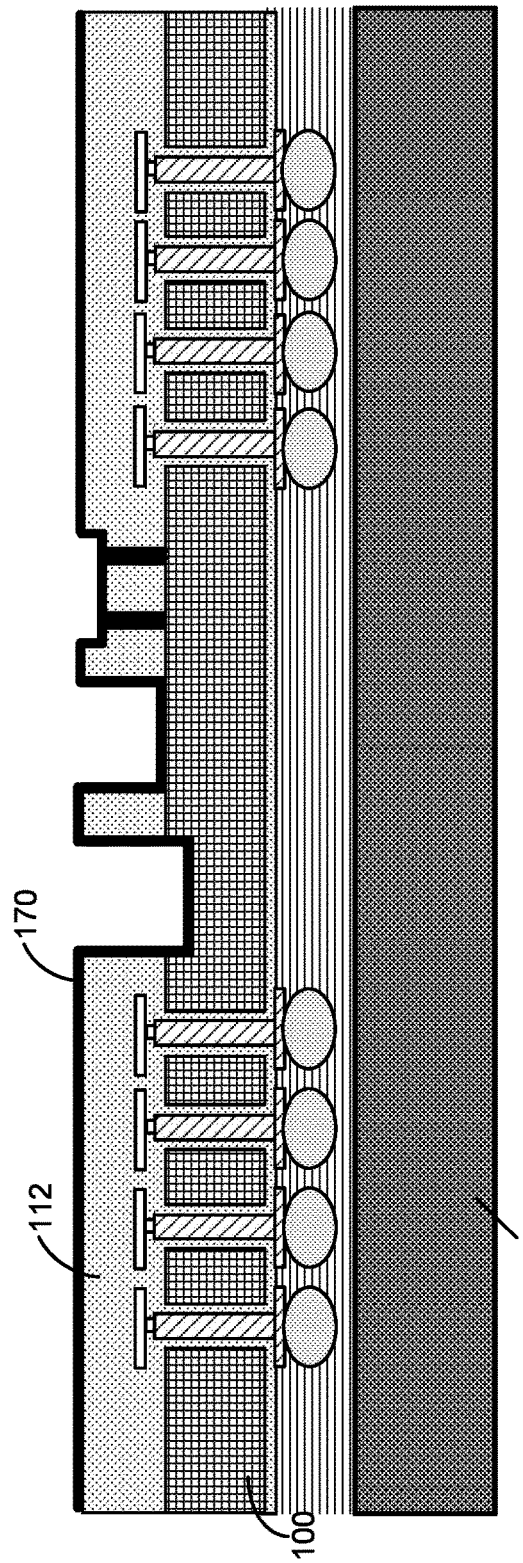

Referring to FIG. 16, the method includes a debonding process to remove the first handle wafer from the front side of the silicon substrate. As shown, the first handle wafer is removed while the temporary adhesive material coated on the front side is cleaned. The mask layer 170 now is revealed again at the front side, which still substantially covers the first passivation layer 112 as well as the primary structures associated with optical features. Now the second handle wafer 300 remains to be bonded with the back side of the silicon substrate 100, allowing the front side being ready for further front side processes to form a silicon photonics TSV interposer.

Figure 17:
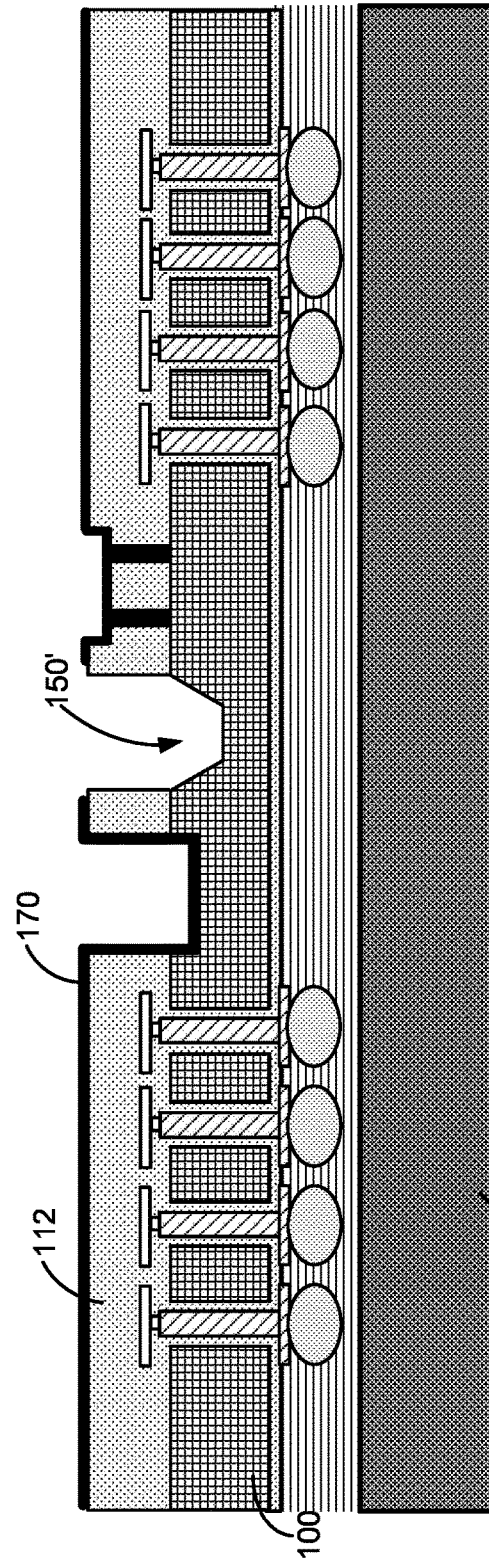

FIG. 17 shows a step of the front side process to form secondary structures based on the primary structures associated with optical features. Referring to FIG. 17, a patterning and etching process is performed to specifically open up a window of the mask layer 170 the second structure 150. The mask layer 170 is hard silicon nitride ($Si_3N_4$). No silicon or silicon oxide etching is occurred at the same time. Afterward, a chemical bath process is performed to further etch down the silicon material from the bottom of the second structure 150 to form a V-groove 150'. Optionally, KOH chemical bath is a preferred process for forming the V-groove. Optionally, TMAH chemical bath is another preferred process for forming the V-groove. After V-groove is formed, the $Si_3N_4$ hard mask 170 is removed via hot phosphorus acid.

Figure 18:
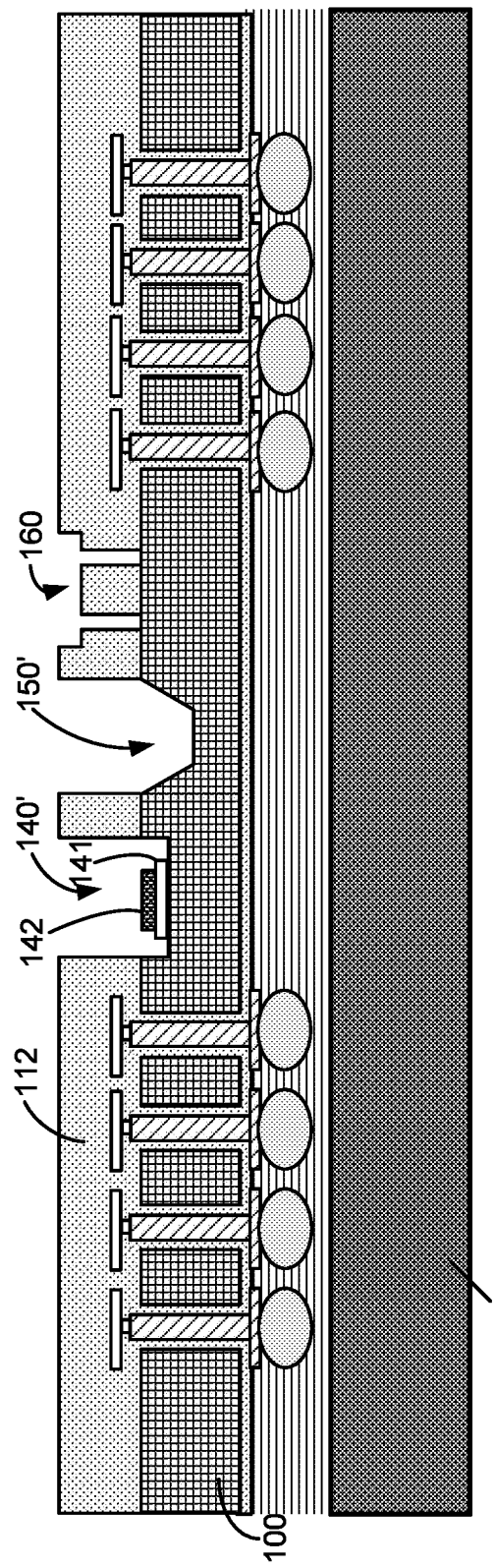

FIG. 18 shows another step of the front side process to form secondary structures based on the primary structures associated with optical features. As shown, remaining portion of the mask layer 170 is fully removed in this step by hot phosphorus acid. Subsequently, an under-bump metallization (UBM) structure 141 is formed at the bottom of the trench structure 140 of the primary structures associated with optical features. Specifically, the UBM formation can be done by sputtering TiW and Au followed by a lift-off process. Optionally, the UBM formation can be done by electrochemical plating. Additionally, on top of the UBM structure 141, a solder pad 142 is formed. In particular, the solder pad 142 is made by AuSn alloy material. Sputtering of AuSn alloy can be done and followed by a lift-off process to form the solder pad 142. At this time, the trench structure 140 is updated to a new trench structure 140'. Overall, the two steps mentioned above lead to a formation of the secondary structures referred to the new trench structure 140', the V-groove 150', and the first structure 160. Both steps are performed when the second handle wafer 300 is bonded to the back side of the silicon substrate 100 to allow the front side process to be done properly.

Figure 19:
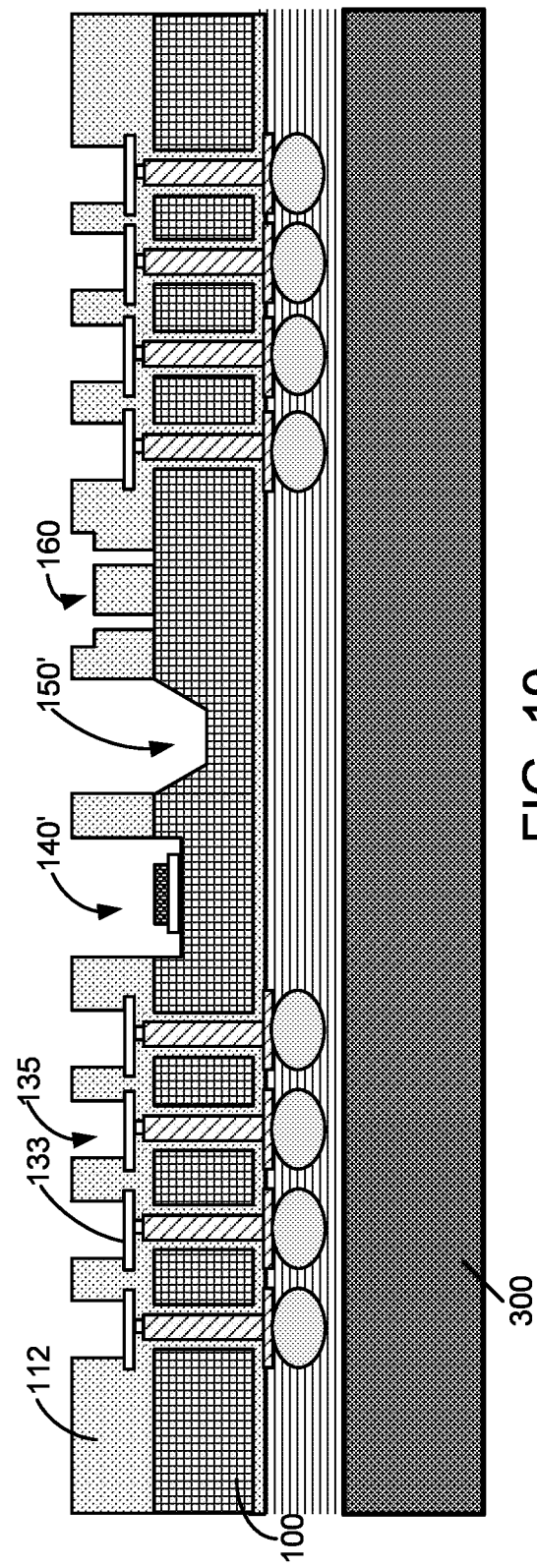

FIG. 19 shows another step of front side process with the support of the second handle wafer 300 bonded to the back side of the silicon substrate 100. As shown, the first passivation layer 112 is patterned and etched to open up multiple windows 135 that each reveals a portion of an extended metallization structure 133 coupled to the conductive material 130 in TSVs.

Figure 20:
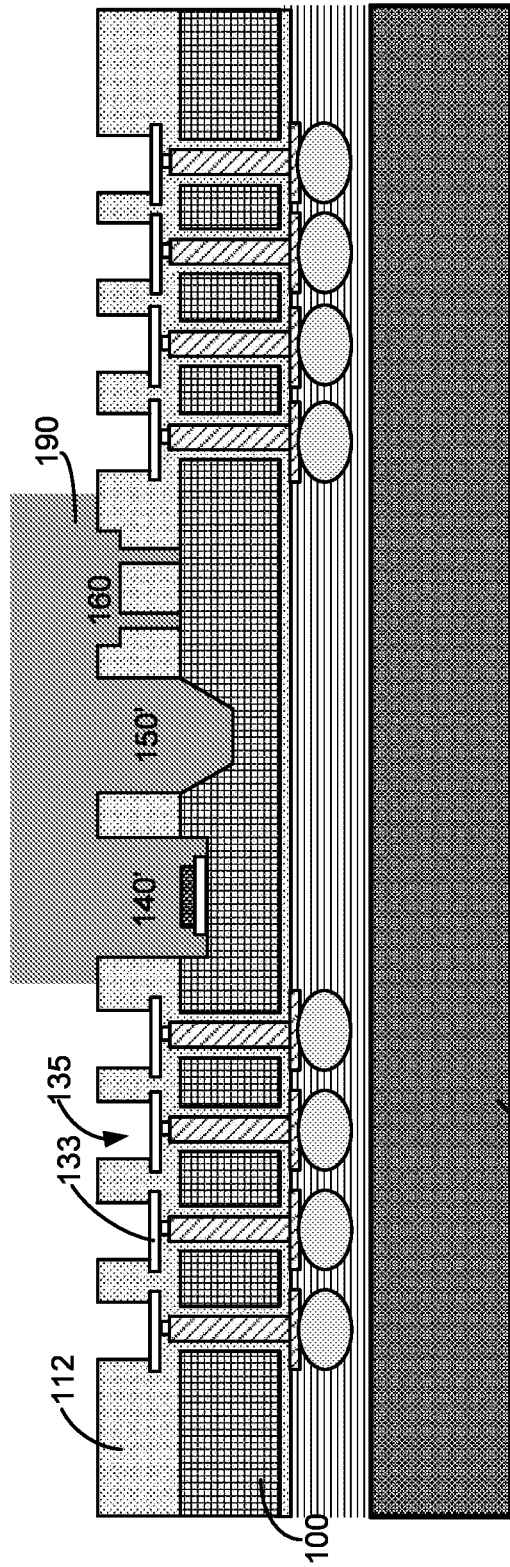
Figure 21:
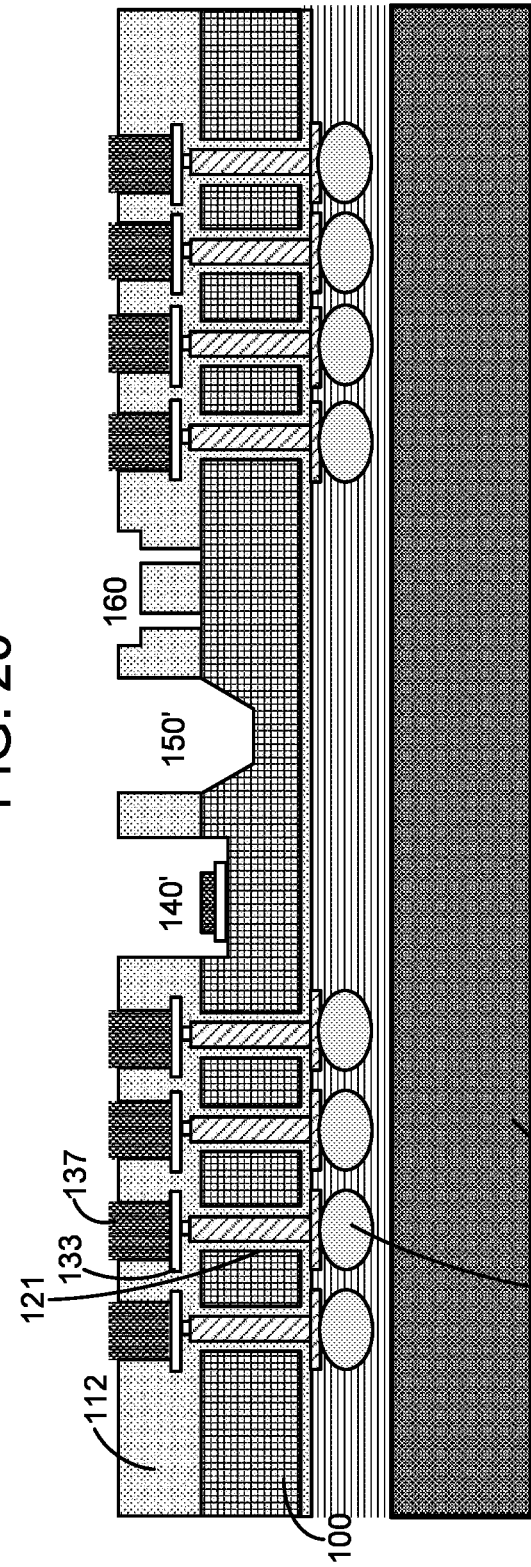

Subsequently, FIG. 20 shows that a step of placing a patterned photo-resist layer 190 over the secondary structures (140', 150', and 160) associated with optical features on the front side. A next step, as shown in FIG. 21, is to perform a metal plating process to form a plurality of conductive pads 137 respectively inside the multiple windows 135 opened up in the first passivation layer 112. In particular, an electroless nickel electroless palladium immersion gold (ENEPIG) process is performed. Optionally, each conductive pad 137 is formed with its top part protruded above the first passivation layer 112. With the protection of the patterned photo-resist layer 190, the secondary structures associated with optical features on the front side will not subjected to any damage by the metal plating process. Referring to FIG. 21, a follow-up process is done to remove the patterned photo-resist layer 190 after the formation of the plurality of conductive pads 137 to complete the TSV process. In other words, the plurality of vias 121 formed in the silicon substrate 100 are transformed to a plurality of conductive TSVs with each TSV being an electrical conduction path from a conductive pad 137 at the front side through the conductive material 130 filled in the vias 121 to a solder bump 136 at the back side (which is still buried in the temporary adhesive material 182 bonded with the second handle wafer 300).

FIG. 22 shows a final step of the front side process for completing final structures associated with optical features. As the final structures associated with optical features involve some most fragile structures, the step for completing final structures associated with optical features is preferred to be done after all steps of the front side process finish. In other word, this step is performed lastly for forming the silicon photonics TSV interposer. In the example shown in FIG. 22, completing the final structures includes forming a suspended coupler in the first structure 160. In particular, the forming a suspended coupler is to release Si material to form a cavity 163 inside the silicon substrate below a waveguide layer 164 (e.g., part of the silicon oxide material above the silicon material). The process includes a first isotropic Si etching through both the first deep narrow trench 161 and the second deep narrow trench 162 formed in the first structure 160 followed by a deep anisotropic Si etching to form the cavity 163. The waveguide layer 164 suspended over the cavity 163 is configured to be an optical coupler for coupling light from fiber into Si photonics TSV interposer or coupling light from Si photonics TSV interposer out to optical fiber.

FIG. 23 shows a step of debonding the second handle wafer from the back side of the silicon substrate. As all steps of the front side process after the TSV formation are completed, the second handle wafer 300 is removed with all the temporary adhesive material 182 on the back side is cleaned. This again reveals the back side structure of the silicon substrate formed earlier, including all the solder bumps associated with the TSVs. In fact, FIG. 23 shows that a silicon photonics TSV interposer 1000 is delivered with all TSVs being completed each with a full electrical conduction path from a conductive pad 137 at the front side through the conductive material 130 to a solder bump 136 at the back side as well as all final structures associated with optical features ready for plugging optical devices.

In another aspect, the present disclosure provides a method of making an optical-electrical module based on silicon photonics TSV interposer. The method includes forming a silicon photonics TSV interposer using the method described herein as illustrated in all figures from FIG. 1 through FIG. 23. The method of making the optical-electrical module further includes attaching a laser device to couple at least an electrode with a solder pad in a trench structure of the final structures associated with optical features in a front side of the silicon photonics TSV interposer. Additionally, the method includes fixing a fiber into a V-groove of the final structures with a lid. The fiber is coupled at least with the laser device. Furthermore, the method includes disposing a transimpedance amplifier (TIA) module chip that is flipped in orientation to have multiple electrodes of the TIA module chip coupled with some of the plurality of conductive pads in the front side of the silicon photonics TSV interposer. Moreover, the method of making the optical-electrical module includes disposing a driver chip that is flipped in orientation to have multiple electrodes of the driver chip coupled with some of the plurality of conductive pads in the front side of the silicon photonics TSV interposer.

Figure 24:
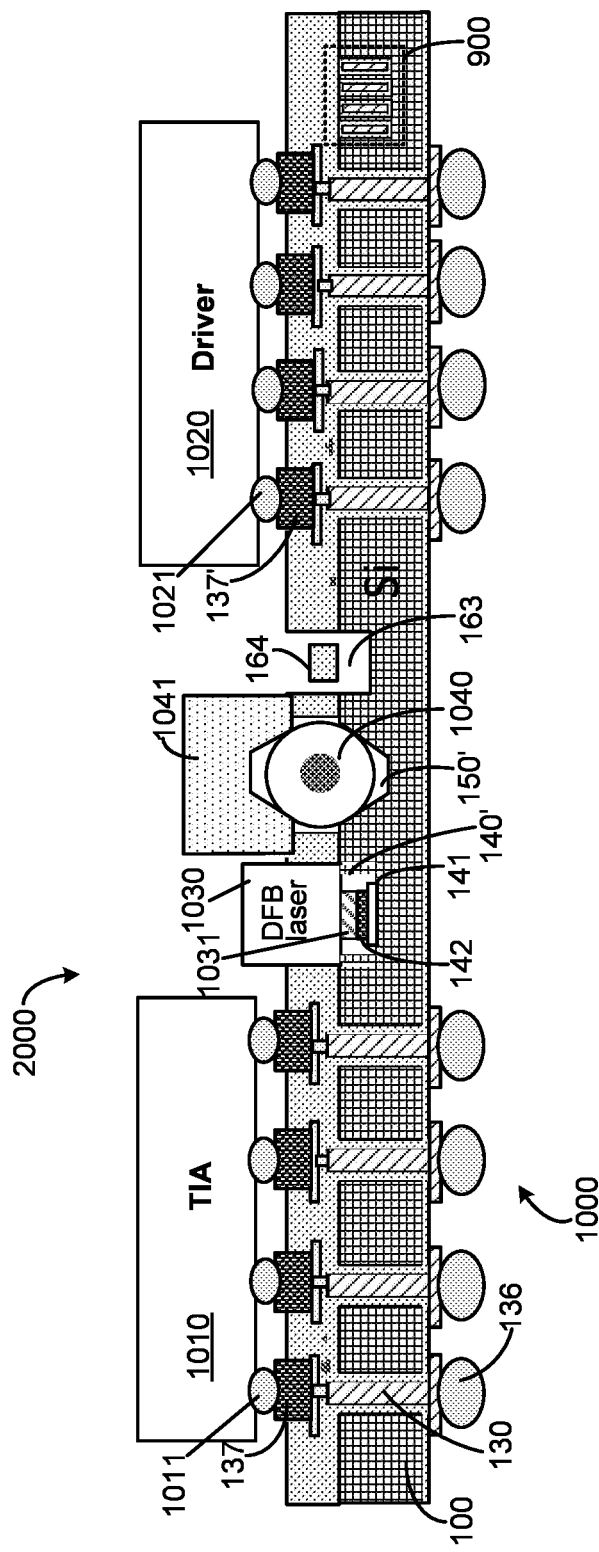
FIG. 24 is a schematic sectional view of an optical-electrical module based on the silicon photonics TSV interposer according to an embodiment of the present invention.

In yet another aspect, the present disclosure provides an optical-electrical module based on silicon photonics TSV interposer. FIG. 24 is a schematic sectional view of an optical-electrical module based on the silicon photonics TSV interposer according to an embodiment of the present invention. As shown, the optical-electrical module 2000 includes a silicon substrate 100 including a front side and a back side and a plurality of through-silicon vias (TSVs) 130 formed in a first region of the silicon substrate 100. Each TSV 130 is configured to fill a conductor material ended with a pad 137 at the front side and a bump 136 at the back side. The optical-electrical module 2000 further includes a coupler 164 suspended over a cavity 163 in the front side. The cavity 163 is formed in a second region isolated from the first region after the plurality of TSVs 130 including the pads 137 and the bumps 136 is formed. Additionally, the optical-electrical module 2000 includes a laser device 1030 disposed in a trench 140' in the second region of the front side. Optionally, the laser device 1030 is a DFB laser having at least an electrode 1031 coupled directly with a solder pad 142 on an under-bump metallization structure 141 in the trench 140'. Furthermore, the optical-electrical module 2000 includes a fiber 1040 installed in a V-groove 150' in the second region of the front side. The fiber 1040 is configured to couple with the coupler 164 and the laser device 1030. Optionally, the fiber 1040 is fixed by a lid 1041. Moreover, the optical-electrical module 2000 includes one or more electrical IC chips having electrodes coupled directly with some pads 137 at the front side of the silicon photonics TSV interposer that electrically connected to some bumps 136 at the back side through the conductive material in the plurality of TSVs 130. Optionally, the one or more electrical IC chips include a transimpedance amplifier (TIA) module 1010. Optionally, the TIA module is a flip chip having electrodes 1011 facing directly towards some conductive pads 137 on the front side of the silicon photonics TSV interposer to form direct electrical connection without any wirebonds. Optionally, the one or more electrical IC chips include a driver module 1020 configured as a flip chip with multiple electrodes 1021 facing directly towards some other conductive pads 130' on the front side of the silicon photonics TSV interposer to form direct electrical connection without any wirebonds. Optionally, the optical-electrical module 2000 further includes multiple multi-layer capacitors formed in the front side of the silicon photonics TSV interposer. Optionally, the optical-electrical module 2000 can be applied as an on-board module coupled together with a gear box or retimer module. The on-board module is then mounted with a switch on a same PCB and connected to an optical connector via a fiber to connect to external optical network and very-short reach (VSR) electrical interface for communicating with electrical network for data center switch application.

In still another aspect, the present disclosure provides a light engine based on the silicon photonics TSV interposer. FIG. 25 is a schematic sectional view of a light engine with a switch and co-integrated the optical-electrical module based on the silicon photonics TSV interposer according to an embodiment of the present invention. As shown, the light engine 3000 is provided with a switch 2050 co-integrated with the optical-electrical module 2000 based on the silicon photonics TSV interposer described herein. The light engine uses host FEC to draw control signals without using gear box and retimer module. The optical-electrical module 2000 is coupled to the optical connector via a fiber for connecting to external optical network and using Ultra-Short-Reach (USR) or Extra-Short-Reach (ESR) electrical interface to communicate with electrical network in data center switch application.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A pluggable optical communications device comprising:
   a light engine comprising:
   a silicon photonics interposer comprising a plurality of through-silicon vias (TSVs) and a plurality of mounting elements formed in the silicon photonics interposer;
   circuitry disposed on the silicon photonics interposer and coupled to first terminals of the TSVs;
   an optical fiber mounted into a first mounting element in the silicon photonics interposer;
   a laser device disposed in a second mounting element in the silicon photonics interposer;
   an optical coupler mounted in a third mounting element in the silicon photonics interposer, the optical coupler configured to provide optical coupling among the optical fiber, the laser device, and the circuitry through the silicon photonics interposer; and
   a printed circuit board (PCB), the light engine being pluggable to the PCB via second terminals of the TSVs.

2. The pluggable optical communications device of claim 1 wherein the first mounting element includes a groove within which the optical fiber is mounted, the second mounting element includes a first trench within which the laser device is disposed, and the third mounting element includes a second trench in which the optical coupler is mounted.

3. The pluggable optical communications device of claim 2 wherein the laser device comprises a distributed feedback (DFB) laser having an electrode coupled directly to an electrically conductive pad disposed in the first trench.

4. The pluggable optical communications device of claim 1 wherein the optical coupler is suspended in the third mounting element.

5. The pluggable optical communications device of claim 1 wherein the optical coupler is configured to provide optical coupling directly between the optical fiber and the laser device and to provide optical coupling between the optical fiber and the circuitry through the silicon photonics interposer.

6. The pluggable optical communications device of claim 1 wherein the circuitry is connected to the first terminals of TSVs by directly contacting electrically conductive pads disposed on the first terminals of the TSVs, without using wire bonds.

7. The pluggable optical communications device of claim 1 further comprising multi-layer capacitors formed on the silicon photonics interposer, the multi-layer capacitors being configured to function as at least one of DC blocking capacitors and bypass capacitors.

8. The pluggable optical communications device of claim 1 wherein the first mounting element is a V-shaped groove, the light engine further comprising a lid disposed on the optical fiber and the V-shaped groove, the lid configured to cover the optical fiber and the V-shaped groove.

9. The pluggable optical communications device of claim 1 wherein the circuitry is configured to process signals output to and received from the light engine.

10. The pluggable optical communications device of claim 1 further comprising a processor mounted on the PCB and coupled to the light engine via electrical connections through the PCB, the processor configured to communicate with an optical communications network, wherein the optical fiber is coupled to a connector on the PCB that is configured to connect the light engine and the processor to the optical communications network.

* * * * *